(12) United States Patent
Nakano et al.

(10) Patent No.: US 8,310,047 B2
(45) Date of Patent: Nov. 13, 2012

(54) SOLDER LAYER, HEAT SINK USING SUCH A SOLDER LAYER AND METHOD FOR MANUFACTURING SUCH A HEAT SINK

(75) Inventors: Masayuki Nakano, Chiyoda-ku (JP); Yoshikazu Oshika, Chiyoda-ku (JP)

(73) Assignee: Dowa Electronics Materials Co., Ltd., Tokyo (JP)

( * ) Notice: Subject to any disclaimer, the term of this patent is extended or adjusted under 35 U.S.C. 154(b) by 597 days.

(21) Appl. No.: 12/067,355

(22) PCT Filed: Sep. 19, 2006

(86) PCT No.: PCT/JP2006/318531
§ 371 (c)(1),
(2), (4) Date: Jun. 8, 2010

(87) PCT Pub. No.: WO2007/034791
PCT Pub. Date: Mar. 29, 2007

(65) Prior Publication Data
US 2010/0263849 A1    Oct. 21, 2010

(30) Foreign Application Priority Data
Sep. 26, 2005   (JP) .................................. 2005-278958

(51) Int. Cl.
*H01L 23/34*       (2006.01)
(52) U.S. Cl. ......................................... 257/720
(58) Field of Classification Search ................... 257/720
See application file for complete search history.

(56) References Cited

U.S. PATENT DOCUMENTS
6,455,408 B1    9/2002   Hwang et al.

FOREIGN PATENT DOCUMENTS

| EP | 1 542 271 A1 | 6/2005 |
|---|---|---|
| JP | 58-16554 A | 1/1983 |
| JP | 63-164326 A | 7/1988 |
| JP | 6-140540 A | 5/1994 |
| JP | 2000-114685 A | 4/2000 |
| JP | 2001-274499 A | 10/2001 |

(Continued)

OTHER PUBLICATIONS

Machine Translation of JP 2001-274499.*

(Continued)

*Primary Examiner* — Anthony Ho
(74) *Attorney, Agent, or Firm* — Chen Yoshimura LLP

(57) ABSTRACT

A heat sink (10) is disclosed which comprises a substrate (1), an electrode layer (2) formed on the substrate (1) and a solder layer (3) formed on the substrate (1) wherein the solder layer (3) provides a bonding strength of not less than 30 MPa and a shear strain of not less than 0.07. The heat sink may be a sub-mount which comprises a sub-mount substrate (1), an electrode layer (2) formed on the substrate (1) and a solder layer (3) formed on the substrate (1) wherein the electrode layer (2) is formed with a window portion (2A) having the solder layer (3) embedded therein and is connected to an outer peripheral area of the solder layer (3). A sub-mount that has a high strength of bonding between the solder layer (3) and a semiconductor device is provided at a reduced cost.

10 Claims, 8 Drawing Sheets

FOREIGN PATENT DOCUMENTS

JP 3509809 B 1/2004
JP 2005-286274 A 10/2005

OTHER PUBLICATIONS

European Search Report dated Feb. 15, 2012, in a counterpart European patent application No. 06810273.0. (This European Search Report cites U.S. Patent No. 1 and Foreign Patent document Nos. 1-2 above.).

Translation of PCT/ISA/237, IB338, and IB373 of PCT/JP2006/318531.

Nakahara et al., "Room Temperature Interdiffusion Studies of Au/Sn Thin Film Couples", Thin Solid Films, vol. 84, pp. 185-196, 1981. Mentioned on p. 2 of the as-filed translation of the specification as concise explanation of relevance.

International Search Report (ISR) for PCT/JP2006/318531 for Examiner consideration, citing foreign references Nos. 1-5 listed above.

PCT/ISA/237 in PCT/JP2006/318531 and its translation of Section V.

* cited by examiner

SOLDER LAYER, HEAT SINK USING SUCH A SOLDER LAYER AND METHOD FOR MANUFACTURING SUCH A HEAT SINK

TECHNICAL FIELD

The present invention relates to a solder layer for use in packaging a semiconductor device, a heat sink using such a solder layer and a method for manufacturing such a heat sink.

BACKGROUND ART

In packaging a semiconductor device, the semiconductor device is usually mounted on a substrate high in heat conductivity, i.e., a heat sink to efficiently dissipate the heat emitted from the semiconductor device. Further by interposing a small heat sink, so called sub-mount, between the heat sink and the semiconductor device, the heat is further efficiently dissipated. Aluminum nitride (AlN) or others is used as such a heat sink high in heat conductivity.

If a heat sink having a semiconductor device chip mounted thereon is to be connected with the semiconductor device chip or a heat sink is to be connected with a cooling plate, they are connected together via a solder layer formed on one or each of both sides of the heat sink. In the interest of reducing its load on the environment it is proposed that the solder layer is formed of a lead (Pb) free solder e.g., Au—Sn, Ag—Sn, In—Sn or Zn—Sn solder.

In the case where an electrode layer made of gold (Au) is formed on the heat sink or the sub-mount substrate and is formed thereon with a solder layer of Pb free solder such as Au—Sn, Non-patent Reference 1 reports that gold of the electrode layer easily diffuses into the solder layer which itself is in non-equilibrium state and which will progress into equilibrium state if left at room temperature.

And, in the case where a solder layer of Au—Sn is formed on an electrode layer of Au as the uppermost layer, gold of the electrode layer diffuses into the solder layer, modifying the composition of the solder layer. Consequently, the composition proportion of gold in the solder layer is increased by gold diffusing into the Au—Sn solder layer, thereby raising the melting point of the solder layer itself. For this reason, the need has arisen to solder a semiconductor device at a temperature higher than the melting point determined by the composition of Au—Sn first formed. As a result, the temperature difference from the heat resistant temperature of a semiconductor device is reduced, giving rise to the problem of a defect in the semiconductor device.

To prevent interdiffusion between a solder layer and an electrode layer, it is known to provide an electrode structure that a solder barrier layer is formed between the solder and electrode layers.

FIG. 8 is a cross sectional view diagrammatically illustrating a structure of a sub-mount 50 having a conventional solder barrier layer. The conventional sub-mount 50 comprises a sub-mount substrate 51; an adherent layer 52 formed on an upper surface of the sub-mount substrate 51, namely on a surface of its side on which a semiconductor device is to be mounted; an electrode layer 53 formed on the adherent layer 52; a solder barrier layer 54 formed on the electrode layer 53; and a solder layer 55 formed on the solder barrier layer 54. The solder barrier layer 54 is composed of platinum (Pt) or palladium (Pd) to prevent gold of which the electrode layer 53 is composed from diffusing into the solder layer 55, thereby preventing the rise in melting point of the solder layer up.

Patent Reference 1 discloses a technique in which a noble metal such as platinum or palladium as a solder barrier layer and a transition metal element such as titanium (Ti) as an adherent layer directly beneath the solder layer are deposited to raise the bonding strength of a sub-mount and a semiconductor device to be mounted thereon to 40 MPa or more.

Patent Reference 1: Japanese Patent No. JP 3509809 B
Non-patent Reference 1: S. Nakahara and three others "ROOM TEMPERATURE INTERDIFFUSION STUDIES OF Au/Sn THIN FILM COUPLES", Thin Solid Films, Vol. 84, pp 185-196, 1981.

DISCLOSURE OF THE INVENTION

Problems to be Solved by the Invention

However, while in the conventional sub-mount substrate, providing a solder barrier layer allows limiting diffusion of metal of an electrode layer into a solder layer and raising the bonding strength to 30 Ma or more and thus reducing initial bonding failure, the shear strain of the solder layer is small. Consequently, when a light emitting device is being turned on and off repeatedly, the solder layer tends to be detached from the heat sink due to a difference in thermal expansion coefficient between them and tends to bring about a failure in electrical conduction. Also, the need for the solder barrier layer to be formed of expensive, noble metal such as platinum or palladium makes the sub-mount highly costly.

With these problems taken into account, it is a first object of the present invention to provide a solder layer that provides a high bonding strength and a large shear strain between the solder layer and a semiconductor device to be mounted thereon. It is a second object of the invention to provide a heat sink using the solder layer, and it is a third object of the invention to provide a method for manufacturing such a heat sink.

Means for Solving the Problems

In order to achieve the first object mentioned above, there is provided in accordance with the present invention a solder layer characterized in that it provides a bonding strength of not lower than 30 MPa and a shear strain of not lower than 0.07.

The solder layer is preferably composed of a Pb free solder material containing two or more elements selected from the group which consists of silver, gold, copper, zinc, nickel, indium, gallium, bismuth, aluminum and tin.

According to the makeup mentioned above, since the bonding strength is high and the shear strain is large when a semiconductor device is connected with the solder layer, the detaching of the semiconductor device from the solder layer can be prevented even if a thermal load is applied.

In order to attain the second object mentioned above, there is also provided in accordance with the present invention a heat sink comprising a substrate, an electrode layer formed on the substrate and a solder layer formed on the substrate, characterized in that the solder layer provides a bonding strength of not lower than 30 MPa and a shear strain of not lower than 0.07.

According to the aforementioned makeup which requires that the electrode and solder layers be formed directly or preferably via the adherent layer on the substrate which is good in heat dissipation, when the electrode is connected to an overlapping portion of the solder layer it is possible to provide a heat sink in which the electrode layer and the semiconductor layer are electrically connected to each other. Since the bonding strength is high and shear strain is large when the semiconductor device is connected with the solder layer, detaching of the semiconductor device from the solder layer can be prevented even if a thermal load is applied.

Said electrode layer preferably is formed with a window portion having said solder layer embedded therein and is connected to an outer peripheral area of said solder layer. Further preferably, said solder layer has an overlapping portion connected to an upper surface of said electrode layer and thereby electrically connected to said electrode layer. Said solder layer has a width $L_1$ at said overlapping portion and a width L at its uppermost surface wherein $L_1/L$ ratio is preferably not more than 10%, and it may more preferably be not more than 4.4%.

Said solder layer is preferably composed of a Pb free solder material containing two or more elements selected from the group which consists of silver, gold, copper, zinc, nickel, indium, gallium, bismuth, aluminum and tin. Said electrode layer is preferably composed of a material containing one, or two or more of metals selected from the group which consists of gold, platinum, silver, copper, iron, aluminum, titanium and tungsten.

According to the aforementioned makeup which requires that the electrode and solder layers be formed on the substrate and the electrode layer be connected to the overlapping portion of the solder layer, it is possible to provide a heat sink in which the electrode layer and the semiconductor layer are electrically connected to each other.

In the makeup mentioned above, the heat sink preferably comprises an adherent layer formed on said substrate and an electrode and a solder layers connected to said adherent layer, that said solder and electrode layers are disposed above said adherent layer and that said solder layer is connected to said electrode layer via said adherent layer.

Said adherent layer is interposed each between said substrate and said electrode layer and between said substrate and said solder layer. Said adherent layer may be composed of a material in which its principal component is a metal or alloy of metals selected from the group which consists of titanium, nickel, chromium and molybdenum. Said substrate is preferably composed of a material selected from the group which consists of aluminum nitride, silicon carbide and silicon.

According to the aforementioned makeup, it is possible to provide a heat sink in which the electrode and solder layers are electrically connected to each other via the adherent layer and which provides a high bonding strength and a large shear strain for a semiconductor device when connected with the solder layer. Consequently, it is possible to minimize diffusion of an electrode metal from the metal electrode into the solder layer and to effectively prevent rise in melting point of the solder layer. This eliminates the need to provide a solder barrier layer using an expensive noble metal between the electrode and solder layers and makes it possible to provide a heat sink at low cost.

In order to achieve the third object mentioned above, there is also provided in accordance with the present invention a method for manufacturing a heat sink, characterized in that it comprises the steps of: forming an electrode layer having a window portion on a substrate; and forming a solder layer electrically connected to said electrode layer in said window portion.

In the step of forming said solder layer, said solder layer is desirably formed with an overlapping portion connected to an upper surface of said electrode layer.

According to the aforementioned method for manufacturing such a heat sink in which the electrode and solder layers are formed on the substrate and further the solder layer is formed with an overlapping portion such as to cover an upper surface of the electrode layer, it is possible to prevent rise in melting point of the solder layer while maintaining the electrode and solder layers connected electrically to each other without providing a solder barrier layer. As the need is eliminated to provide a solder barrier layer using a noble metal between the electrode and solder layers, it is possible to manufacture a heat sink at a reduced cost.

Effects of the Invention

According to the present invention, there are provided a solder layer, a heat sink using the solder layer and a method for manufacturing such a heat sink in which the solder layer provides a bonding strength of not less than 30 MPa and a shear strain of not less than 0.07.

DESCRIPTION OF REFERENCE CHARACTERS

Figure 1:
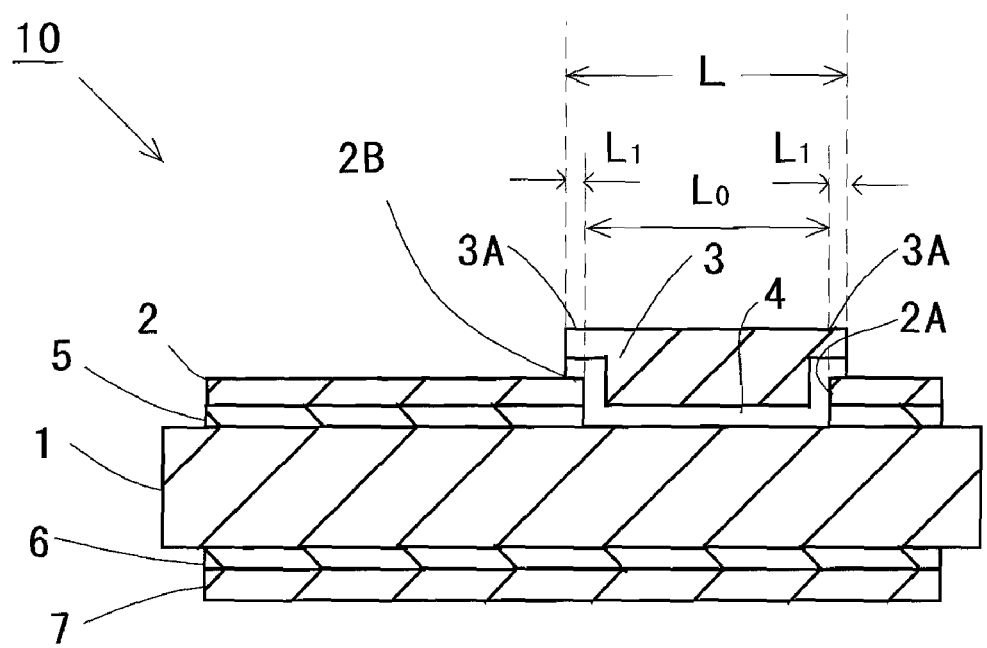
FIG. 1 is a cross sectional view diagrammatically illustrating a structure of a sub-mount in accordance with the present invention.

In the Figures:
1: sub-mount substrate (heat sink)
2, 32: electrode layer
2A: window portion
2B: upper surface
3, 7, 34: solder layer
3A: overlapping portion of the solder layer
4, 33, 41: adherent layer (below the solder layer)
4A: overlapping portion of the adherent layer
5: adherent layer (below the electrode layer)
6: adherent layer (at the back side of the substrate)
8: semiconductor device
8A: lower electrode
8B: upper electrode
9A, 9B: gold wire
10, 10A, 20: sub-mount (heat sink)
30: sub-mount of Comparative Example 1
40: sub-mount of Comparative Example 2
42: barrier layer of Comparative Example 2

BEST MODES FOR CARRYING OUT THE INVENTION

Referring now to the Drawing Figures, an explanation is given in detail of forms of implementation of the present invention. In the Figures, the same reference characters are used to designate the same or corresponding components. In these forms of implementation, an explanation is given of an example using the heat sink as a sub-mount.

FIG. 1 is a cross sectional view diagrammatically illustrating a structure of a sub-mount 10 in accordance with the present invention. As shown in FIG. 1, the sub-mount 10 of the present invention comprises a sub-mount substrate 1, an electrode layer 2 formed on the sub-mount substrate 1 and a solder layer 3 formed adjacent to the electrode layer 2 on the sub-mount substrate 1 wherein the electrode layer 2 is connected to an outer peripheral area of the solder layer 3. To with, the electrode layer has a window portion 2A having the solder layer 3 embedded therein via an adherent layer 4 and is electrically connected to the outer peripheral area of the solder layer 3. In this case, the window portion 2A of the electrode layer has a width $L_0$.

Here, the window portion 2A of the electrode layer is the region that is opened in the electrode layer 2 to form the solder layer 3. The window portion 2A of the electrode layer is where the electrode layer 2 is not formed by a process step such as of etching. There may also be interposed an adherent layer 5 between the electrode layer 2 and the sub-mount substrate 1 as shown in the figure.

If the solder layer 3 is made thicker than the electrode layer 2 and is made to include an overlapping portion 3A with the electrode layer 2, it can be made easier to form electrical connection between the electrode layer 2 and the solder layer 3. In this case, the overlapping portion 3A of the solder layer beneath it preferably comes in contact with the electrode layer 2 via the adherent layer 4 and allows the adhesive layer 4 to effectively prevent the solder layer 3 and the electrode layer 2 from reacting with each other. As shown, the uppermost surface of the solder layer 3 has a width L and its overlapping portion 3A has a width $L_1$. The width of the overlapping portion 3A provided for the solder layer may have a size such that the resistance between the solder layer 3 and the electrode layer 2 becomes sufficiently small.

Figure 2:
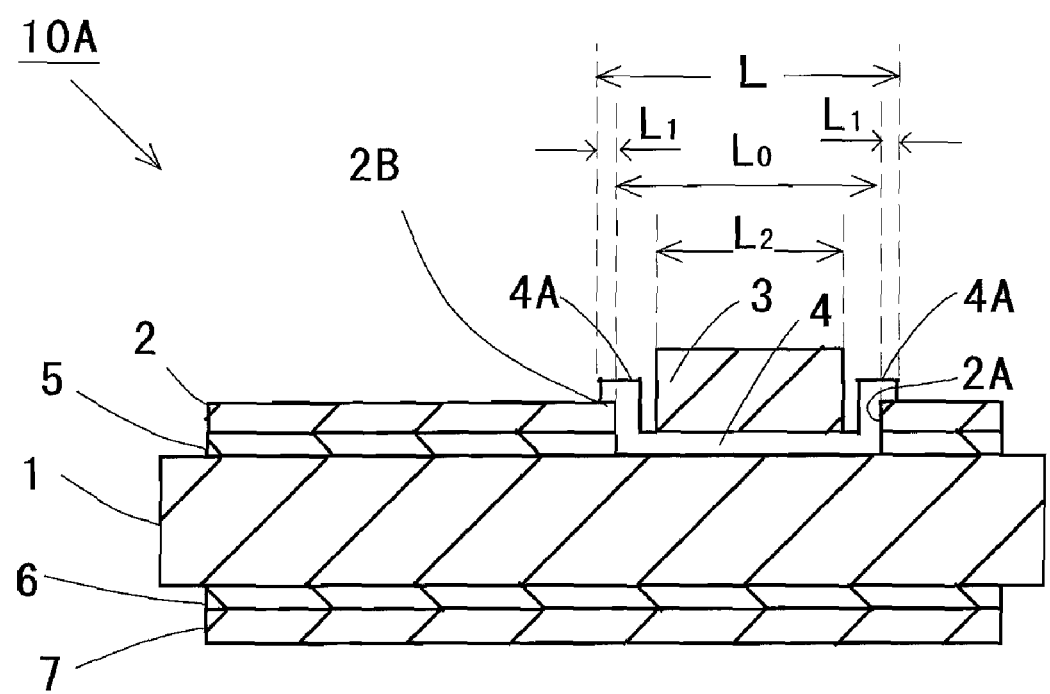
FIG. 2 is a cross sectional view diagrammatically illustrating a modified structure of a sub-mount in accordance with the present invention.

FIG. 2 is a cross sectional view diagrammatically illustrating a modified structure of a sub-mount in accordance with the present invention. In the sub-mount 10A, the electrode layer 2 and the solder layer 3 may be connected with each other via the adhesive layer 4 as is shown in FIG. 2. In this case, the solder layer 3 has a width $L_2$ which is smaller than that of the window portion 2A of the electrode layer and the adherent layer has an outer peripheral portion 4A (with width $L_1$) such as to cover an upper surface 2B of the electrode layer. This outer peripheral portion 4A with the width $L_1$ constitutes the overlapping portion with the electrode layer 2. The construction elsewhere is identical to that of the sub-mount 10 shown in FIG. 1 and its repeated explanation is therefore omitted.

The window portion of the electrode layer 2 may be of square, circular or any desired shape, according to which the overlapping portion 3A of the solder layer and the overlapping portion 4A of the adherent layer may be shaped. If it is circular in shape, the width of the solder layer 3 is then its diameter.

Here, the electrical connection between the electrode layer 2 and the solder layer 3 in the sub-mounts 10 and 10A means that when the electrode layer 2 is connected to the overlapping portion 3A of the solder layer or the overlapping portion 4A of the adhesive layer, the electrical resistance caused between the electrode layer 2 and the solder layer 3 is quite low, and is defined as a connection such that such as a semiconductor device mounted on the solder layer 3 as will be described later becomes equal in potential to the electrode layer 2.

In this case, by making the ratio of width $L_1$ of the overlapping portion 3A, 4A to width L of the solder layer 3, namely $L_1/L \leq 10\%$, the solder layer 3 can be connected with a semiconductor device at a bonding strength of not less than 30 MPa, i.e., a practical bonding strength, when the semiconductor device is mounted on the solder layer 3 as will be described. Preferably by setting $L_1$ and L to make $L_1/L \leq 4.4\%$, it is possible for the solder layer 3 in connecting to provide a bonding strength of not less than 40 MPa, a highly reliable strength of adhesion. By so setting $L_1/L$, it is possible to reduce the resistance caused between the solder layer 3 and the electrode layer 2 and at the same time to raise the strength of connecting of the solder layer 3 with a semiconductor device and increase the shear strain of the solder layer 3.

The sub-mount substrate 1 used may be an insulating substrate such as aluminum nitride (AlN), silicon carbide (SiC), silicon (Si) or diamond II a having a high thermal conductivity.

Material used for the electrode layer 2 is preferably a low resistive metal which may be any one of gold (Au), platinum (Pt), silver Ag), copper (Cu), iron (Fe), aluminum (Al), titanium (Ti) and tungsten (W). It may contain two or more of these metals. The electrode layer 2 may be shaped in the form of a selected circuit pattern and may have a gold or aluminum wire at its portion bonded for connection to an external terminal to form an electrical circuit.

The solder layer 3 is preferably of a solder not containing Pb, namely a Pb free solder which desirably contains two or more elements selected from the group consisting of silver, gold, copper, zinc (Zn), nickel (Ni), indium (In), gallium (Ga), bismuth (Bi), aluminum and tin (Sn). A preferred material used for the solder layer 3 is an Au—Sn alloy which is composed of Au and Sn proportioned at atomic ratio of, e.g., 70:30 (Au:Sn=70:30).

Further, in order to enhance adherence between the sub-mount substrate 1 and the electrode layer 2, an adherent layer 5 as shown in FIG. 1 is preferably provided between the sub-mount substrate 1 and the electrode layer 2, namely beneath the electrode layer 2.

The lower surface of the sub-mount substrate 1, that is, its rear surface usually to be adhered on a heat sink, is in part or wholly formed, as shown e.g., in FIG. 1, with an adherent layer 6 on the substrate rear side and a solder layer 7 on the adherent layer 6. Then, the adherent layer 6 and the solder layer 7 on the rear side of the sub-mount substrate 1 may be composed of materials identical to or different from those of which the adherent layer 4, 5 and the solder layer 3 provided on the front side of the sub-mount substrate 1 are composed.

The adherent layer 4, 5, 6 used is preferably composed of a metal of good adherence with the sub-mount substrate 1, high in melting point and hard to cause the interdiffusion with the solder layer 3, 6. The adherent layer 4, 5, 6 may also be composed of a material of which the principal component used and formed is a metal, or an alloy containing a metal, such as titanium, chromium, nickel or molybdenum.

As mentioned above, the sub-mount 10, 10A of the present invention is formed connecting the electrode layer 2 and the solder layer 3 on the upper surface of the sub-mount substrate 1, preferably via the adherent layer 4, and maintains the electrical connection of the electrode layer 2 and the solder layer 3, with the upper portion 3A of the solder layer 3 covering the top open end 2B of the window portion 2A of the electrode layer 2.

Mention is next made of mounting a semiconductor device by a sub-mount of the present invention.

Figure 3:
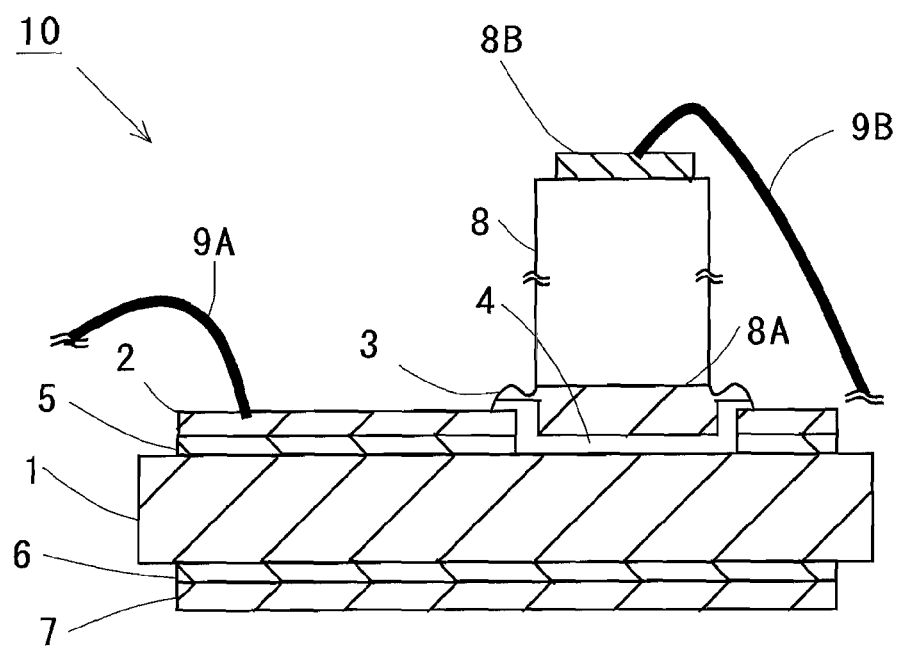
FIG. 3 is a cross sectional view diagrammatically illustrating the state that the sub-mount of FIG. 1 has a semiconductor device mounted thereon.

FIG. 3 is a cross sectional view diagrammatically illustrating the structure in which the semiconductor device 8 is mounted on the sub-mount 10, 10A of FIG. 1. As shown in FIG. 3, the semiconductor device 8 is connected by soldering with the solder layer 3 via its lower electrode 8A in the sub-mount 10, 10A. In this case, the lower electrode 8A of the semiconductor device is directly in contact with the solder layer 3, and the solder layer 3 in the absence of an interdiffusing metal such as gold in its lower part has a melting point determined by its composition. If the solder layer 3 is formed of a Pb free solder, its melting point is not raised. Consequently, the semiconductor device 8 can be soldered on the sub-mount 10, 10A in the present invention at a low temperature in the neighborhood of the melting point of the Pb free solder layer 3 determined by its composition. In the absence of an interdiffusing metal such as gold in the lower part of a solder layer 3 as in the prior art, it is possible to markedly reduce the failure of a semiconductor device 8 with a rise of the soldering temperature.

The lower electrode of the semiconductor device 8 is electrically connected to the electrode layer 2 via the solder layer 3. The electrode layer 2 is connected to an external terminal not shown by wire bonding with a gold wire 9A. And, the semiconductor device 8 has an upper electrode 8B that is connected to an external terminal not shown by wire bonding with a gold wire 9B. This completes forming an electrical circuit with the semiconductor device 8, the solder layer 3, the electrode layer 2 and the gold wires 9A and 9B. Here, the semiconductor device 8 may be a light emitting device such as a laser diode or a light emitting diode, a diode, an active device such as a transistor or a thyristor for use in high-frequency amplification and switching or an integrated circuit. When the active device has a high power handling capability such as a transistor or thyristor, the heat sink may be made by increasing the area of the sub-mount substrate 1 according to its needed power handling capability.

According to the sub-mount 10, 10A of the present invention, no solder barrier layer may be required between the electrode layer 2 and the solder layer 3 to permit firmly connecting the semiconductor device 8 and the solder layer 3. According to the sub-mount 10, 10A of the present invention in which the sub-mount substrate 1 is formed thereon with the electrode layer 2 having the window portion 2A and the solder layer 3 embedded therein and the electrode layer 2 and the solder layer 3 are electrically connected to each other so that the area of contact between the solder layer 3 and the open end of the electrode layer 2 is minimized, it is possible to limit diffusion from the electrode layer 2 into the solder layer 3 without requiring a solder barrier layer formed of a noble metal material such as platinum or palladium between the electrode layer 2 and the solder layer 3 and thereby to prevent a rise in melting point of the solder layer 3 due to a change in its composition. Consequently, it is possible to prevent connecting failure of chip in soldering due to the rise in melting point of the solder layer, thereby attaining an improvement in the yield.

According to the solder layer 3 and the sub-mount or heat sink 10, 10A using the former, it is possible to improve the adhesion strength and the shear strain in soldering. Especially, it is possible to reduce the connecting failure of the semiconductor device 8 and to effectively prevent detachment after soldering with the bonding strength between the solder layer 3 and the semiconductor device 8 raised to not less than 30 MPa and the shear strain raised to not less than 0.07. If the shear strain is low, it is undesirably that then the solder layer 3 is harder and the semiconductor device 8 tends to detach from the solder layer 3 owing to thermal stress attributable to a difference in thermal expansion between the sub-mount 10, 10A and the semiconductor device 8. If the shear strain is increased, the solder layer 3 is softer to reduce the stress so that it becomes tougher against the tensile stress due to a difference in thermal expansion developed when the semiconductor device 8 is operated. If the solder layer 3 softens the stress, the thermal stress created when the semiconductor device 8 is electrically conducting is lightened as well. For example, the stress by the thermal expansion which is caused when a light emitting diode 8 mounted on the solder layer 3 is electrically conducting can be relaxed, restraining the solder layer 3 from detaching from the sub-mount substrate 1. If the solder layer 3 is detached, the current density through a portion of the semiconductor device 8 rises so the semiconductor device 8 may fail. According to the solder layer 3 and the heat sink 10, 10A, the solder layer 3 is prevented from detaching.

Mention is now made of a method of manufacturing a sub-mount 10 of the present invention.

A sub-mount substrate 1 is prepared and its both sides are ground by a lapping apparatus. It is further finish-polished using a polishing apparatus. The sub-mount substrate 1 polished is cleansed.

For the sub-mount substrate 1 cleansed, an electrode layer 2 is patterned by photolithography. Specifically, after a resist is coated uniformly over an entire upper surface of the sub-mount substrate 1 with a spinner, it is baked as desired in a baking furnace and then is subjected to contact exposure using a mask aligner.

After the exposure, a portion of the resist where an electrode layer 2 is to be formed is dissolved using a developer of tetramethylamine family to expose the sub-mount substrate 1. As a result, the resist is left undissolved in a region where a solder layer 3 is to be formed, namely where it becomes a window portion 2A. Subsequently, an adherent layer 5 is formed on the sub-mount substrate 1 over an entire surface thereof. The adherent layer 5 may be formed by vapor deposition using a vacuum vapor deposition apparatus or a sputtering apparatus.

Next, a metal to form an electrode layer 2 is vapor-deposited by such as the vacuum vapor deposition apparatus, and the entire resist is dissolved using acetone so that metal on areas other than those becoming the electrode layer 2 is removed by lift-off to form the desired electrode layer 2 eventually. In this manner, the electrode layer 2 having a window portion 2A can be formed by lift-off.

Then, as in the process of forming the electrode layer 2, the lift-off using photolithography and the vacuum vapor deposition apparatus is used to form a solder layer 3 so as to be embedded in the window portion 2A of the electrode layer 2. Specifically, a resist is coated uniformly over an upper surface of the sub-mount substrate 1 having the electrode layer 2 and the adherent layer 5 formed thereon, after which it is baked as desired and then subjected to contact exposure. After the exposure, a portion of the resist where a solder layer is to be formed, namely a portion of the resist on the window portion 2A is dissolved using a developer of tetramethylamine family to expose an open end of the window portion 2A on the adherent layer 5 and the electrode layer 2. At this point of time, the resist in a region where the solder layer 3 is to be formed has been removed. Further, in order to form an overlapping portion 3A of the solder layer, the exposure is preferably followed by using a mask pattern for window portion 2A whose circumference is increased by a length corresponding to width $L_1$ of the overlapping portion 3A on the electrode layer.

Next, a metal becoming an adherent layer 4 beneath the solder layer 3 is vapor-deposited in vacuum.

Subsequently, a metal becoming the solder layer 3 is vapor-deposited so as to be thicker than the electrode layer 2 and the entire resist is dissolved using acetone or the like so that a portion of the solder layer except a region where the adherent layer 4 and solder layer 3 are to be formed is lifted off and thereby removed. In this way, it is possible to form the solder layer 3 embedded in the window portion 2A of the electrode layer. Further, the solder layer 3 having the overlapping portion 3A can be formed easily by adjusting such as the mask pattern. The overlapping portion 3A of the solder layer should preferably have a minimum width required to maintain the solder layer 3 electrically connected to the electrode layer 2 as mentioned above.

Next, a solder layer 7 is formed on its rear side of the sub-mount substrate 1. In this case, an adherent layer 6 may be interposed between the rear surface of the substrate 1 and the solder layer 7.

Finally, portions of the adhesive layers exposed to the surfaces of the sub-mount substrate 1 are removed by etching to expose the surfaces of the sub-mount substrate 1, and the sub-mount substrate 1 thus obtained is cut into a desired size of the sub-mount 10 with such as a dicing machine.

In the sub-mount manufacturing method of the present invention, the electrode layer 2 is formed on the sub-mount substrate 1, preferably via the adherent layer 5, so as to have the window portion 2A, followed by burying the window portion 2A, and more preferably the adherent layer 4 and the solder layer 3 are formed so as to have the overlapping portion 3A with the electrode layer. Consequently, a need to provide a solder barrier layer of a noble metal such as Pt is eliminated, thus reducing the number of process steps required for manufacture. Thus, according to the sub-mount manufacturing method of the present invention, it is unnecessary to provide a solder barrier layer, which must be formed from a noble metallic material such as expensive platinum and palladium, between the electrode layer 2 and the solder layer 3 and it is therefore possible to provide the solder layer 3 at a reduced cost having high bonding strength and high shearing stress.

EXAMPLE 1

The present invention will further be described in detail with reference to Examples.

Figure 4:
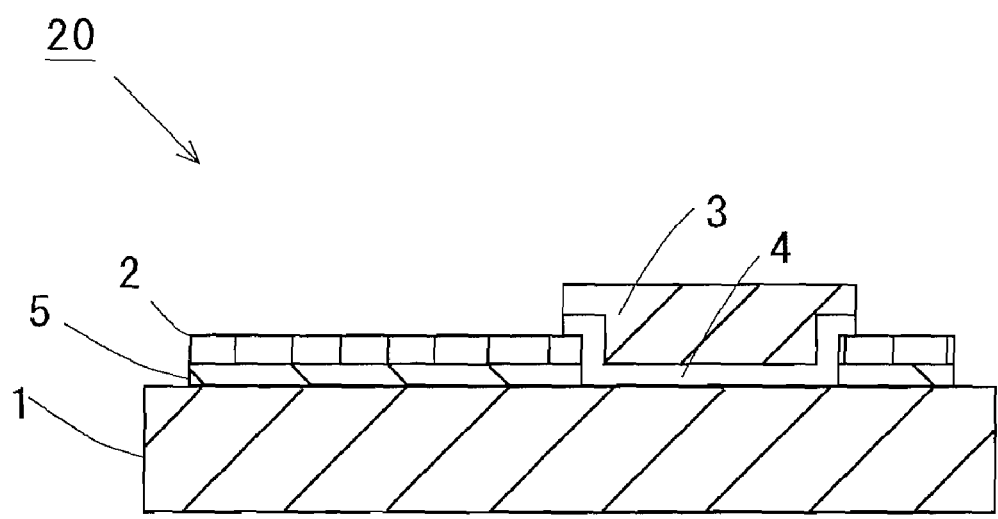
FIG. 4 is a cross sectional view diagrammatically illustrating a sub-mount made in Examples.

FIG. 4 is a cross sectional view diagrammatically illustrating a sub-mount 20 made in Example 1.

First, the sub-mount 20 is made.

Surfaces on both sides of a sintered aluminum nitride substrate 1 having high thermal conductivity (230 W/mK) of 55 mm square and of 0.3 mm thick were ground with a lapping machine and then were finish-polished with a polishing machine.

Subsequently, a resist was coated uniformly over an entire upper surface of the substrate by using a spinner in order to make patterning by using photolithography. The resist was baked as desired in a baking furnace and then is subjected to contact exposure using a mask aligner. A mask for the exposure was designed so that a sub-mount size of 1 mm square can be patterned.

After the exposure, a portion of the resist where an electrode layer 2 is to be formed was dissolved using a developer of tetramethylamine family to expose the surfaces of the substrate 1. The resist remains formed on a portion becoming a window portion 2A.

The polished aluminum nitride substrate 1 was used as a sub-mount substrate and was washed to clean its entire surface, over which an adherent layer 5 consisting of titanium was built up by the vacuum vapor deposition apparatus to a thickness of 50 nm.

Then, gold was vapor-deposited by the vacuum vapor deposition apparatus and acetone was used to dissolve the entire resist whereby Au except for the electrode layer 2 was lifted off and removed to form the electrode layer 2 having the window portion 2A to a thickness of 0.2 μm.

As in forming the electrode layer 2, the photolithography and the vacuum vapor deposition apparatus were used to form an adherent layer 4 of 50 nm thick and a solder layer 3 of 3.5 μm thick on the surface of the aluminum nitride substrate 1 by lift-off. The solder layer 3 had a composition such that Au and Sn were contained at an atomic ratio of 70:30. The solder layer 3 had a size of width L=500 μm square and its overlapping portion 3A had a width $L_1$ of about 1 μm. Then, $L_1/L$ is equal to 0.2%.

Finally, the aluminum nitride substrate obtained was cut into 1 mm square as a sub-mount size by dicing machine etc. and the sub-mount 20 of Example 1 was thus made.

EXAMPLE 2

A sub-mount 20 of Example 2 was made in the same manner as in Example 1 except that the overlapping portion 3A of the solder layer has a width $L_1$ of 22 μm. Then, $L_1/L$ is equal to 4.4%.

EXAMPLE 3

A sub-mount 20 of Example 3 was made in the same manner as in Example 1 except that the overlapping portion 3A of the solder layer has a width $L_1$ of 50 μm. Then, $L_1/L$ is equal to 10%.

Mention is next made of Comparative Examples.

COMPARATIVE EXAMPLE 1

Figure 5:
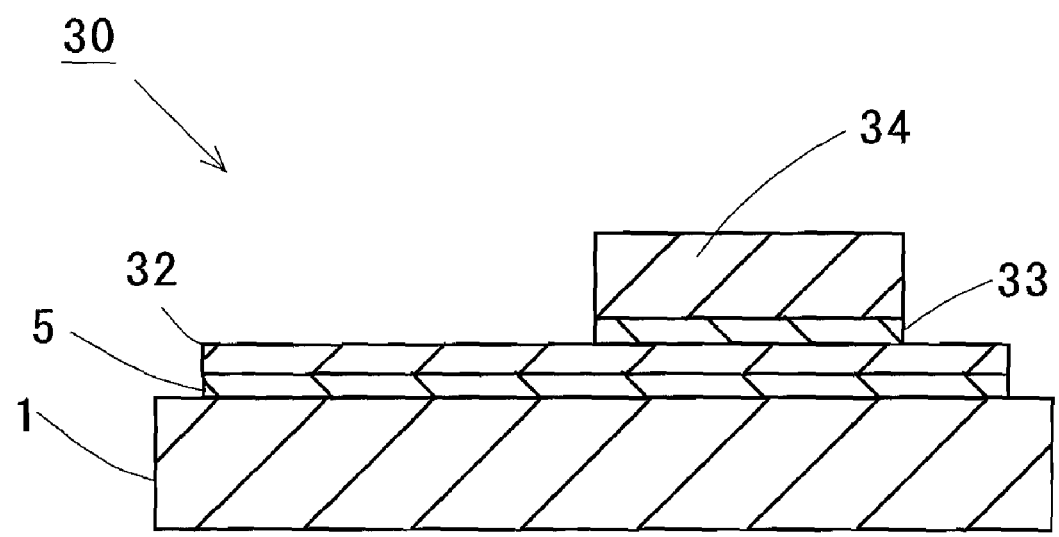
FIG. 5 a cross sectional view diagrammatically illustrating a sub-mount made in Comparative Example 1.

FIG. 5 is a cross sectional view diagrammatically illustrating a sub-mount 30 made in Comparative Example 1.

The sub-mount 30 of Comparative Example 1 was made in the same manner as in Examples except that an electrode layer 32 of gold was formed on the adherent layer 5 and that an adherent layer 33 and a solder layer 34 which is identical in composition to that in Examples (Au:Sn in atomic ratio=70:30) were formed on a portion of the electrode layer 32.

COMPARATIVE EXAMPLE 2

Figure 6:
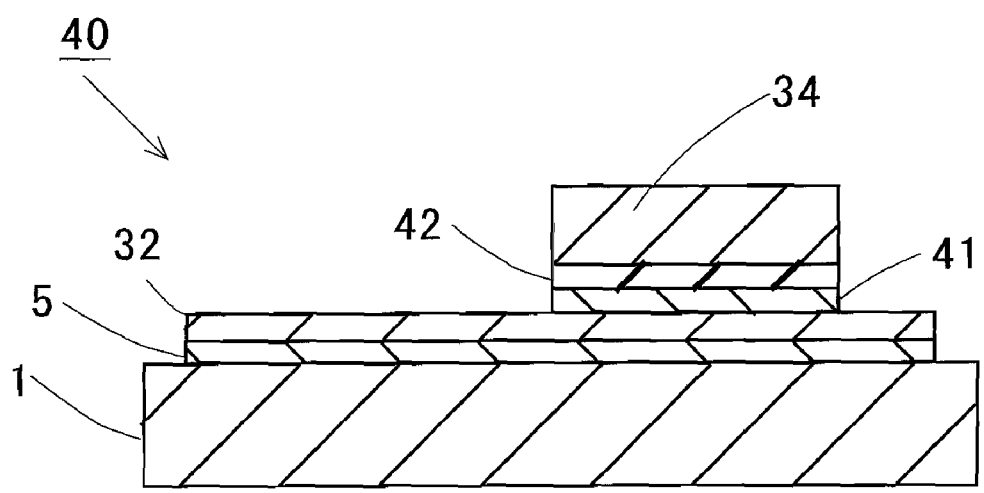
FIG. 6 a cross sectional view diagrammatically illustrating a sub-mount made in Comparative Example 2.

FIG. 6 is a cross sectional view diagrammatically illustrating a sub-mount 40 made in Comparative Example 2. The sub-mount 40 of Comparative Example 2 was made in the same manner as in Examples except that the electrode layer 32 of gold was formed on the adherent layer 5 and that an adherent layer 41 and a solder barrier layer 42 consisting of Pt were formed on a portion of the electrode layer 32, and further that the solder layer 34 which is identical in composition to that in Examples (Au:Sn in atomic ratio=70:30) was formed on the solder barrier layer 42.

A semiconductor device 8 was soldered with each of the sub-mounts 20, 30 and 40 of Examples 1 to 3 and Comparative Examples 1 and 2 via the solder layers 3 and 34 to prepare samples. Specifically, samples were prepared by melting the solder layer 3, 34 of the sub-mount with a heater and then disposing a light emitting diode of 300 μm square as the semiconductor device 8 on the sample followed by soldering the sub-mounts 20, 30, 40 and the semiconductor device 8 together via the solder layer 3, 34. The soldering temperature of this case was 290° C. The number of samples was 100 pieces for each of the Examples and Comparative Examples.

Next, the samples were subjected to a peeling test for light emitting diodes 8. The peeling test was measured by die shear test and the so-called chip shear strengths were measured. The die shear test was conducted in accordance with the MIL standard (MIL-STD-883C, Method 2019.4) and at condition N=10 whereby chip shear strengths were derived from their mean values.

Figure 7:
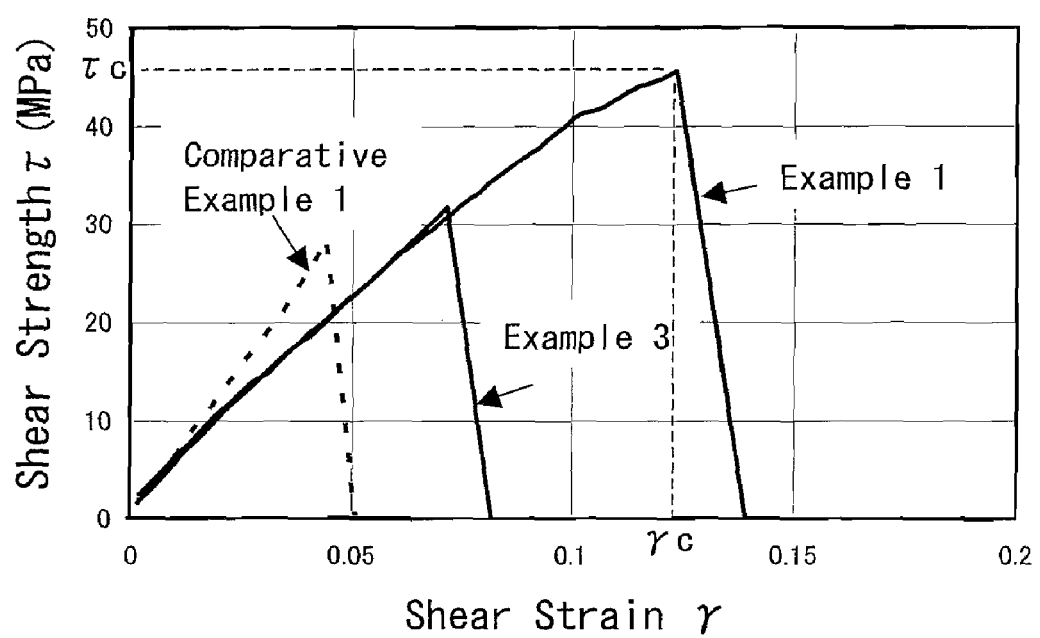
FIG. 7 is a graph illustrating the shear strengths (i) with respect to the shear strains of solder layers in sub-mount for Examples 1 and 2 and Comparative Example 1.
Figure 8:
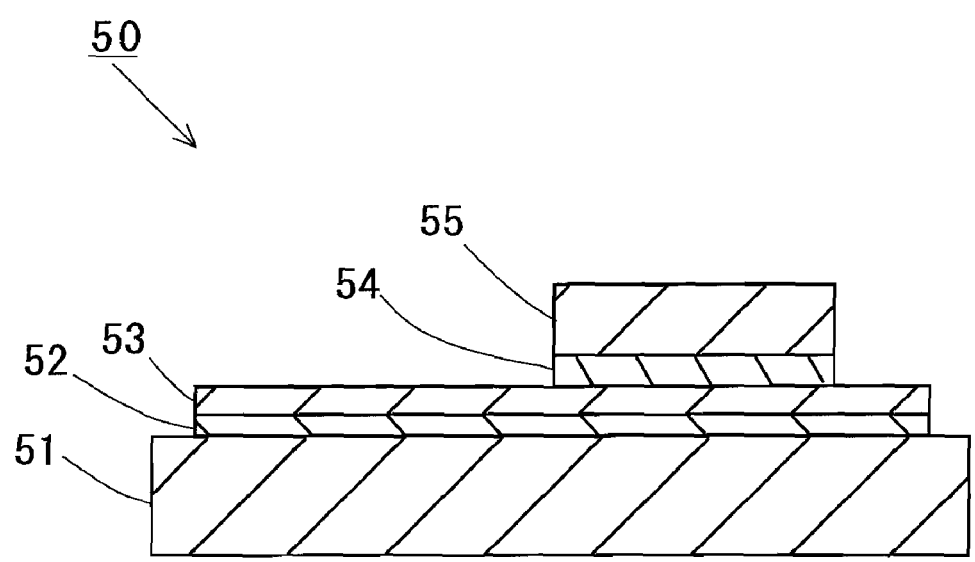
FIG. 8 is a cross sectional view diagrammatically illustrating the structure of the conventional sub-mount having a barrier layer.

FIG. 7 is a graph illustrating the shear strengths (τ) with respect to the shear strains of solder layers 3 and 34 in sub-emitting diode 8 and it is 300 μm. Further, the bonding strength of the solder layer 3 with the light emitting diode 8 was assumed to be the maximum value (τc) of the shear strength and the shear strain of the solder layer 3 to be the shear strain (γc) when the shear strength was the maximum.

As is apparent from FIG. 7, the bonding strengths τc of the solder layers 3 and 34 in Examples 1 and 3 and Comparative Example 1 are 46 MPa, 32 MPa and 29 MPa, respectively. Being not less than about 30 MPa for the solder layers 3 of the sub-mounts 20 in Examples 1 and 3, the stable initial bonding strength was obtained.

Table 1 shows the structures of the sub-mount in each of Examples 1 to 3 and Comparative Examples, the bonding strength (τc) between the solder layer 3 and the light emitting diode 8 therein measured by the die shear test, the shear strain (γc) of the solder layer 3 and the survival ratio (in %) of the light emitting diode in a thermal cycling test to be described later.

TABLE 1

|  | Solder Layer Composition (in Atm. %) | Solder Layer Sub-structure (see Figs.) | $L_1$ ($L_1$/L) L1 = Overlap 3A Width L = Solder Layer Width | Chip Shear Strength (τ c) (MPa) (at Bond. Temp. of 290° C.) | Shear Strain (γ c) (at Bond. Temp. of 290° C.) | LED Survival Ratio (%) (at Bond. Temp. of 290° C.) |
|---|---|---|---|---|---|---|
| Ex. 1 | Au:Sn = 70:30 | Ti/AlN Substrate (FIG. 3) | 1 μm (0.2%) | 46 | 0.123 | 100 |
| Ex. 2 | Au:Sn = 70:30 | Ti/AlN Substrate (FIG. 3) | 2.2 μm (4.4%) | 41 | 0.090 | 94 |
| Ex. 3 | Au:Sn = 70:30 | Ti/AlN Substrate (FIG. 3) | 50 μm (10.0%) | 32 | 0.071 | 82 |
| C-Ex. 1 | Au:Sn = 70:30 | Ti/Au/ Ti/AlN Substrate (FIG. 4) | Whole Solder Surface (100%) | 29 | 0.044 | 37 |
| C-Ex. 2 | Au:Sn = 70:30 | Pt/Ti/Au/ Ti/AlN Substrate (FIG. 5) | Whole Solder Surface (100%) | 41 | 0.062 | 67 | mounts 20, 30 and 40 for Examples 1 and 2 and Comparative Example 1. In the graph, the ordinate axis represents the shear strength (in MPa) and the abscissa axis represents the shear strain. The shear strength was measured by the die shear test. Specifically, a shear tool was applied perpendicularly to the soldering surface of the light emitting diode 8 and the solder layer 3, that is, transversely to a side surface of the light emitting diode 8 and moved horizontally. With the point where it comes in contact with the light emitting diode 8 made as the origin, a load (in kg) which the die shear tool received from the light emitting diode 8 and a displacement (in m) thereof moved relatively from the origin were measured.

From the load and displacement obtained from the above measurement, the shear strength τ (in MPa) and shear strain γ were calculated by equations (1) and (2) below.

Shear strength τ=Load (kg)×Gravitational acceleration (m/s$^2$)/Area of shear plane (m$^2$)

Shear strain γ=Displacement (m)/Length (m) of Shear plane in Shear direction

Here, the area of shear plane is the area of soldering, namely of the bottom face of the light emitting diode 8 (=300 μm×300 μm). The length of shear plane in shear direction is the length perpendicular to the chip side face of the light As is apparent from Table 1, the ratio of width $L_1$ of the solder layer overlapping portion 3A to solder layer width L (namely, $L_1$/L) was 0.2%, the bonding strength was 46 MPa and the shear strain was 0.123 in Example 1. In Example 2, $L_1$/L was 4.4%, the bonding strength was 41 MPa and the shear strain was 0.090. In Example 3, $L_1$/L was 10%, the bonding strength was 32 MPa and the shear strain was 0.071.

On the other hand, the solder layers in Comparative Examples 1 and 2 have the ratio $L_1$/L (width $L_1$ of the solder layer overlapping portion 3A to solder layer width L) of 100%, and bonding strengths of 29 MPa and 41 MPa, respectively, and shear strains of 0.044 and 0.062, respectively.

Mention is next made of a thermal cycling test for the light emitting diode 8 mounted on the sub-mount via the solder layer 3 in each of Examples 1 to 3 and Comparative Examples 1 and 2.

The thermal cycling test was conducted indoor using a heat shock tester (model WINTECH) made by ETAC. One-cycle condition: each light emitting diode 8 with a current of 150 mA flowing therethrough was held in the air at 165° C. for 15 minutes and then cooled within 1 minute to −50° C. and held for 15 minutes. This was repeated 50 times. From the result of this thermal cycling test, the proportion of light emitting diodes 8 which did not result in a current-carrying failure in all light emitting diodes tested was calculated as a survival ratio (%).

As is apparent from Table 1, the survival ratio (%) of the light emitting diodes 8 after the thermal cycle was repeated 50 times for each in Examples 1, 2 and 3 and Comparative Examples 1 and 2 was 100%, 94%, 82%, 37% and 67%, respectively. In the case of the light emitting diode 8 in Example 1, 2 or 3, the solder layer was not detached at all, its survival ratio was not less than 82% and it is seen that reliability is high.

On the other hand, the survival ratio (%) of the light emitting diodes after the thermal cycle was repeated 50 times for each in Comparative Examples 1 and 2 was 37% and 67%, respectively. They had current carrying failures. That is the peeling of the solder layer was caused and the survival ratios are as low as less than 80%.

It has thus become clear that when the LED 8 of Examples 1 to 3 is made to provide a shear strain of not less than 0.07, the survival ratios after the thermal cycling tests have been improved and that the reliability of LED 8 became high.

From the results mentioned above, it is seen that the bonding strength in the case where the ratio of width $L_1$ of the overlapping portion 3A of the solder layer to solder layer width L (namely $L_1/L$) is 10% as in Example 1 is improved over the sub-mount 30 in Comparative Example 1 in which the solder layer 34 of Au—Sn is formed on the gold electrode layer 32 via the adherent layer 33 of titanium. And, it has been found that the sub-mounts in Examples 2 and 3 in which $L_1/L$ is 4.4% or less have their bonding strength made identical to or more than that of the sub-mount in Comparative Example 2 in which the solder barrier layer 41 of Pt is interposed provides adhesiveness high in reliability. According to the sub-mount in Examples 1-3, it has thus been found that the solder layer 3 having high bonding strength can be formed without using any solder barrier layer made of Pt. Further, it has been found possible to improve its shear strain and to obtain a highly reliable soldering junction such that a soldering failure is hardly occurred by the emission of the light emitting diode 8. From the foregoing explanation, it is seen that the sub-mount having high reliability can be obtained at low cost since the expensive noble metal such as Pt is not utilized.

The present invention in its applications is not limited to a sub-mount as described in the specific examples above but is applicable to a heat sink. The present invention allows various modifications within the scope of the invention set forth in the claims and it is needless to say that they should be included by the coverage of the present invention.

What is claimed is:

1. A heat sink comprising:
a substrate;
an electrode layer formed on the substrate, said electrode layer having an opening to expose a surface underneath;
an adhesive layer formed on said surface exposed by said opening of the electrode layer, having an outer peripheral portion connected to said electrode layer;
a solder layer formed on the substrate, said solder layer being embedded in said opening of the electrode layer having the adhesive layer formed therein, said solder layer being connected to said electrode layer via said adhesive layer,
wherein said adhesive layer is made of a metal that has an adhesion property with said surface underneath and that substantially lacks interdiffusibility with said solder layer.

2. The heat sink as set forth in claim 1, wherein said solder layer has an overlapping portion connected to an upper surface of said electrode layer via said outer peripheral portion of said adhesive layer and thereby electrically connected to said electrode layer.

3. The heat sink as set forth in claim 2, wherein said solder layer has a width $L_1$ at said overlapping portion and a width L at its uppermost surface, and $L_1/L$ ratio is not more than 10%.

4. The heat sink as set forth in claim 2, wherein the $L_1/L$ ratio is not more than 4.4%.

5. The heat sink as set forth in claim 1, wherein said solder layer is composed of a Pb free solder material containing two or more elements selected from the group which consists of silver, gold, copper, zinc, nickel, indium, gallium, bismuth, aluminum and tin.

6. The heat sink as set forth in claim 1, wherein said electrode layer is composed of a material containing one, or two or more of metals selected from the group which consists of gold, platinum, silver, copper, iron, aluminum, titanium and tungsten.

7. The heat sink as set forth in claim 1, wherein said substrate is composed of a material selected from the group which consists of aluminum nitride, silicon carbide and silicon.

8. The heat sink as set forth in claim 1, wherein said adhesive layer is made of one of titanium, chromium, nickel, and molybdenum, or an alloy containing any one of titanium, chromium, nickel and molybdenum.

9. The heat sink as set forth in claim 1, wherein said surface underneath is a portion of a top surface of said substrate.

10. The heat sink as set forth in claim 1, wherein said solder layer provides a bonding strength of not lower than 30 MPa and a shear strain of not lower than 0.07.

* * * * *